(12) United States Patent
Ramesh et al.

(10) Patent No.: US 6,586,925 B2
(45) Date of Patent: Jul. 1, 2003

(54) METHOD AND APPARATUS FOR ESTABLISHING QUICK AND RELIABLE CONNECTION BETWEEN A SEMICONDUCTOR DEVICE HANDLER PLATE AND A SEMICONDUCTOR DEVICE TEST HEAD PLATE

(75) Inventors: Ramamoorthi Ramesh, Tamil Nadu, IN (US); Liop-Jin Yap, Singappore (SG)

(73) Assignee: St Assembly Test Services Ltd., Singapore (SG)

( * ) Notice: Subject to any disclaimer, the term of this patent is extended or adjusted under 35 U.S.C. 154(b) by 0 days.

(21) Appl. No.: 09/828,677

(22) Filed: Apr. 9, 2001

(65) Prior Publication Data

US 2002/0145438 A1 Oct. 10, 2002

(51) Int. Cl.[7] .............................................. G01R 31/02
(52) U.S. Cl. ................................................. 324/158.1
(58) Field of Search ........................ 324/158.1, 73.1, 324/758; 73/866.5, 865.8; 414/590

(56) References Cited

U.S. PATENT DOCUMENTS

| | | | |
|---|---|---|---|
| 4,893,074 A | 1/1990 | Holt et al. | 324/158 F |
| 5,149,029 A | 9/1992 | Smith | 248/124 |
| 5,440,943 A | 8/1995 | Holt et al. | 74/89.15 |
| 5,600,258 A | 2/1997 | Graham et al. | 324/758 |
| 6,271,658 B1 * | 8/2001 | Vallinan et al. | 324/158.1 |

* cited by examiner

*Primary Examiner*—Vinh P. Nguyen
(74) *Attorney, Agent, or Firm*—George O. Saile; Stephen B. Ackerman

(57) ABSTRACT

A new method and apparatus is provided to quickly and reliably position, connect and dock a handler plate with a test head plate of a Universal Docking System. A handler plate is provided with roller assemblies while a test head plate is provided with matching receiver block assemblies. The roller assemblies are aligned with and partially inserted into the receiver block assemblies. Part of the roller assembly is mechanically engaged by the receiver block assembly, a mechanical linkage between an operator handle and the receiver block assembly allows the operator to complete the locking of the test head plate with the handler plate thereby at the same time establishing electrical contacts between arrays of pins that are mounted on surfaces of the handler base plate and the test head.

54 Claims, 8 Drawing Sheets

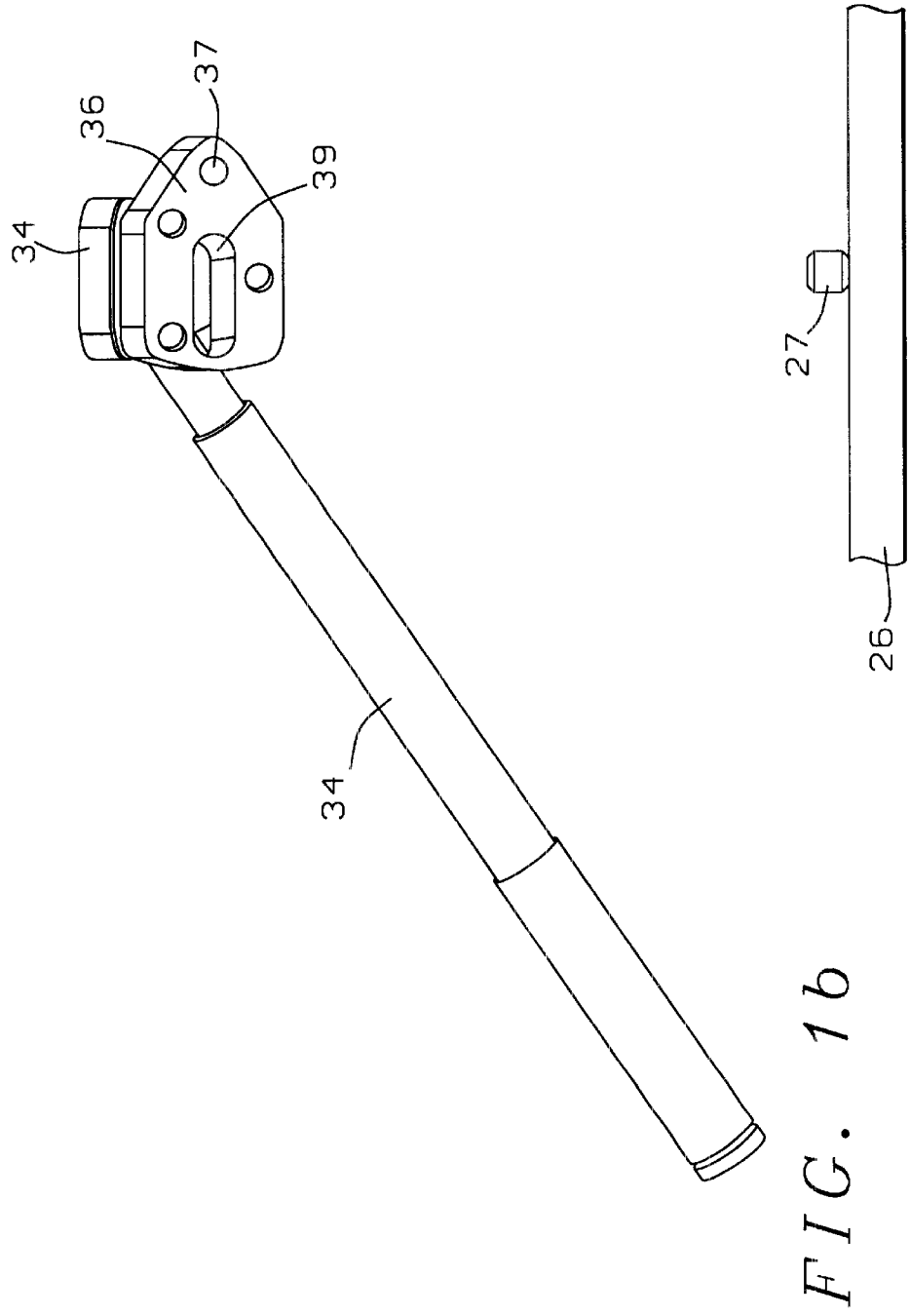

METHOD AND APPARATUS FOR ESTABLISHING QUICK AND RELIABLE CONNECTION BETWEEN A SEMICONDUCTOR DEVICE HANDLER PLATE AND A SEMICONDUCTOR DEVICE TEST HEAD PLATE

This application is related to patent application ST98-005, Ser. No. 09/174,620 filed on Oct. 19, 1998, assigned to a common assignee.

BACKGROUND OF THE INVENTION

(1) Field of the Invention

The invention relates to the fabrication and the testing of Integrated Circuit (IC) devices, and, more particularly, to an apparatus for a robust Universal Docking System that is used for purposes of docking and undocking of an electronic test head with a semiconductor device handler.

(2) Description of the Prior Art

In the automatic testing of Integrated Circuits (IC) and other electronic devices, special device handlers are used to place the device that is to be tested in position. The electronic testing itself is provided by a large and sophisticated automatic testing system that includes a test head. The test head is required to connect to and dock with the device handler. In such testing systems, the test head is usually very heavy. The reason for this heaviness is that the test head uses high-speed electronic timing signals. The electronic test circuits must therefore be located as close as possible to the device under test. Accordingly, the test head has been densely packaged with electronic circuits in order to achieve high speed testing of state of the art devices.

The state of the art leaves much to be desired in providing a manipulator or positioner that readily and accurately moves the heavy test head in position with respect to the device handler mechanism. The user typically must move the heavy device handler or the heavy positioner in order to provide alignment. When the test head is accurately in position with respect to the device handler, the test head and the device handler are said to be aligned. After the test head and the device handler have been aligned, the fragile test head and the device handler electrical connections can be brought together (that is docked) thereby enabling the transfer of test signals between the test head and the device handler. Prior to docking, the test head and the device handler electrical connections must be precisely aligned to avoid damaging the electrical connectors.

In a typical operational environment that has as function the electrical testing of semiconductor devices, the test head is manually guided to connect delicate electrical pins to the contacting plate of the device handler, without thereby making use of alignment guides. After this operation of guiding the test head has been completed (that is the test head has been positioned in the location where the test head can be connected and docked with the device handler) the test head is locked or kept level by means of a device manipulator. This often presents problems during production testing. For instance, the position of the test head can change as a consequence of which the electrical connections with the device handler are interrupted. Or the device handler vibrates causing intermittent electrical connections with the device test head or even causing damage to the electrical equipment.

Due to the complexity and density of advanced, sophisticated semiconductor devices, the number of connections that must be provided to the semiconductor device during the test operation can be very large resulting in a heavy cable that must be connected to the device under test. This heavy cable provides increased weight and mass that further aggravates the problem of establishing and maintaining firm positioning between the test head and the device handler of the semiconductor device. Special arrangements are typically provided for the heavy interconnect cable, which address problems of being able to position the test head into the desired position without interference by the cable, providing flexibility in positioning of the test head without interference by the heavy cable, avoiding interference of the cable with freedom of movement that must by provided to the operator of the test equipment, keeping the length of the cable at a minimum to avoid negative electrical performance aspects that can be introduced as a consequence of a long electrical path to the device under test, maintaining mechanical stability to the combined and interlocked device handler and the test head thereby negating the need for mechanical counterbalancing arrangements, and the like.

Prior Art methods of positioning the test head with respect to the device handler frequently use lead screws and sliding/rotating mechanisms of various designs that assisted in the positioning of the test head with respect to the device handler. These mechanisms are in addition frequently aided by electrical motors that provided three-dimensional degree of movement in addition to rotational movement of the components of the test assembly. The various motions that are provided in this manner are however difficult to control to the required degree of accuracy leading to potential damage to device or test head pins, pins that are in most cases of a delicate nature and therefore easily damaged. The addition of the indicated components such as electrical motors and the like further require extensive floor space and do therefore not meet the need that positioning apparatus must be of a simple but sturdy design.

Semiconductor device testing can further take place in a clean room environment. Where this ability to perform device testing in a clean room environment is required, this requirement must not add a significant amount of either expense or complexity to device testing components such as device handler, test head and positioning and docking arrangements that are required for the device testing. Usable space within a clean environment usually involves considerable expense in providing this clean room environment, further emphasizing the need for test components that are simple in design and sturdy in their application.

U.S. Pat. No. 5,440,943 (Holt et al.) shows test head manipulator that facilitates docking and docking of the test heads and device handlers.

U.S. Pat. No. 4,893,074 (Holt et al.) and U.S. Pat. No. 5,149,029 (Smith) show other testing systems with test heads and device handlers.

U.S. Pat. No. 5,600,258 (Graham et al.) (inTEST Corporation) shows an automated docking test head and device handler.

SUMMARY OF THE INVENTION

The present invention addresses the problem of quickly and reliably positioning and interlocking a Universal Docking system (UDS) handler plate with respect to a UDS test head plate.

The primary objective of the present invention is to provide an apparatus for establishing quick and reliable connections between a semiconductor device handler plate and a semiconductor device test head plate.

Another objective of the present invention is to reduce the negative effect on device yield caused by unreliable interconnection between a device handler plate and a device test head plate.

Yet another objective of the present invention is to reduce the need for device re-testing due to unreliable testing results caused by unreliable device handler plate to device test head plate connections (re-screen downtime reduction).

Yet another objective of the present invention is to reduce the downtime required for changing equipment set-up in semiconductor testing and manufacturing environments.

In accordance with the objectives of the invention a new method and apparatus is provided to quickly and reliably position, connect and dock a handler plate with a test head plate of a Universal Docking System. The handler plate is provided with at least two roller assemblies whereby each roller assembly consists of a main body or block to which four roller bearings or dowel pins are connected whereby the roller bearings protrude from the vertical body of the roller assembly in a horizontal plane. The test head plate is provided with at least two matching (with the roller assemblies of the handler plate) receiver block assemblies to which a sliding block is attached. Each receiving block assembly of the test head plate is provided with a sliding block whereby the sliding blocks are interconnected with a pivoting linkage assembly such that the movements of the sliding blocks (and with that the movements of the receiving blocks) are synchronized with respect to each other. Each sliding block is provided with a cutout that is designed such that a roller bearing (of the roller assembly) can slide through this cutout. After positioning the roller block with respect to the receiver block and engaging (by the sliding block) at least one of the roller bearings of the roller assembly, the sliding block will be (manually) forced in a direction such that the roller bearing (that now slides through the cut-out of the sliding block) will be further inserted into the receiving block. Since the roller assembly is attached to the handler plate and the receiver block is attached to the test head plate, the action of forcing the roller bearing into the receiver block results in forcing the handler plate closer to the test head plate. The pivoting arrangement that is part of the sliding block assembly synchronizes the motions of the sliding blocks such that, for all receiving blocks, the roller bearings will enter the receiving blocks at the same rate resulting in the plane of the handler plate and the plane of the test head plate remaining parallel during the process of bringing the two plates together. After the roller bearings of the roller assemblies have been forced into the receiver blocks, thereby positioning and locking the handler plate with respect to the test head plate, electrical contact between the electrical contacts of the device handler and the electrical contacts of the device test head has been established. The device is now securely positioned for testing.

BRIEF DESCRIPTION OF THE DRAWINGS

FIGS. 1b and 1c show a side view and a cross section of two interacting components that are part of the test head plate of the invention.

DESCRIPTION OF THE PREFERRED EMBODIMENTS

Figure 1A:
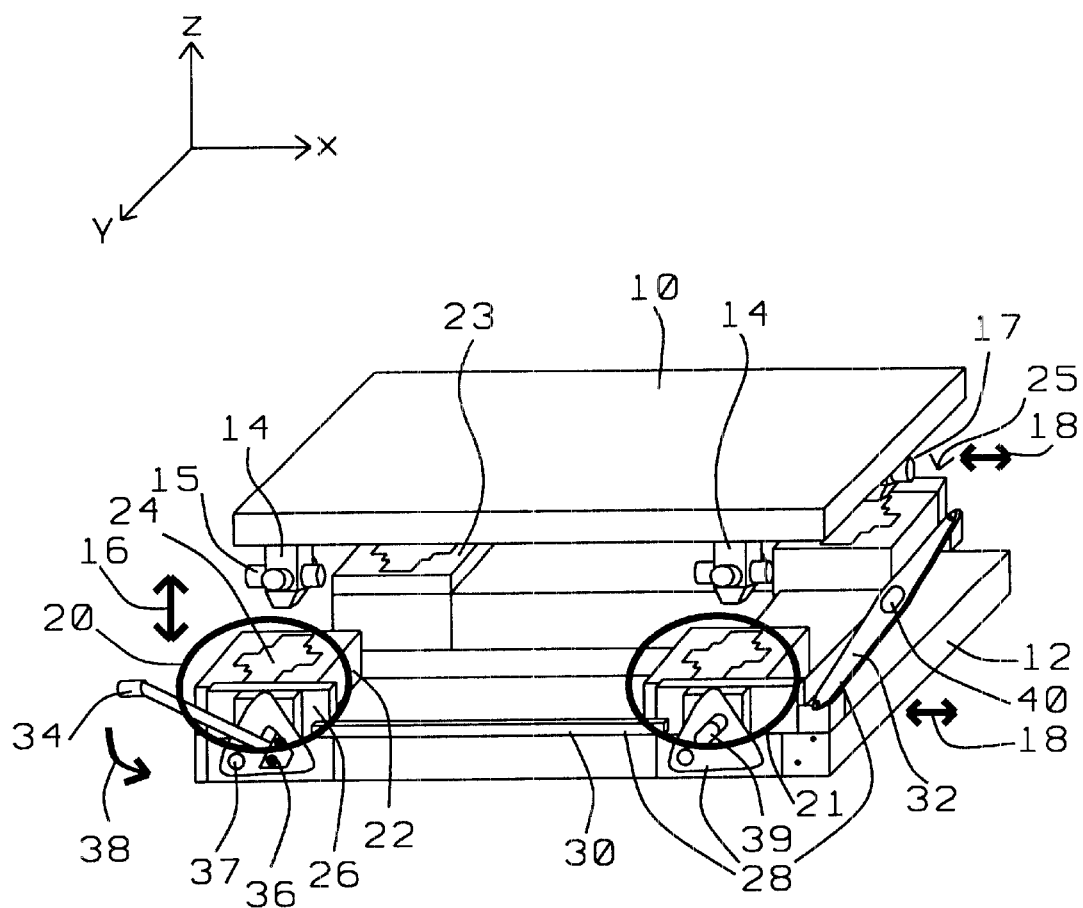
FIG. 1a shows a three-dimensional view of the device handler plate and the device test head plate, components that are part of these two assemblies are highlighted.

Referring now specifically to FIG. 1a, there is shown a three dimensional view of the device handler plate 10 and the device test head plate 12. The handler plate 10 is provided with roller assemblies, the test head plate 12 is provided with receiver blocks to which sliding plates are attached.

The operation of the apparatus of the invention can be summarized as follows: the roller assemblies (part of the handler plate) are aligned with and minimally inserted into the receiver block assemblies (part of the test head plate). Operator action further forces the complete entry of the roller assembly into the receiver block assembly. Operator action requires the turning of a handle, which motion is translated into a motion of sliding plates that are part of the receiver block assembly. This sliding motion results in the indicated insertion of the roller assemblies into the receiver block assemblies.

The components that are part of these two assemblies are the following:

10 is the handler plate 12 is the test head plate 14 is a roller assembly that is part of and attached to the handler plate 10. The handler plate 10 is provided with at least two roller assemblies 14, the three dimensional view that is shown in FIG. 1a shows two roller assemblies 14 that are mounted on opposing corners of the handler plate 10. The handler plate can be provided with a total of four roller assemblies 14 whereby these four roller assemblies are mounted on the four corners of the handler plate 10 with one roller assembly 14 on each of the four corners of the handler plate 10. The method and apparatus of the invention are not limited to four roller assemblies per handler plate but can, dependent on specific design requirements, be extended beyond the number of four; this number can also be reduced to two or three roller assemblies. Roller block assemblies 14 have been provided in the X-direction of the handler plate 10 at a first Y-coordinate of the handler plate 15 is one of the (four) roller bearings that is attached to and forms part of the roller assembly 14; the construct is not limited to four roller bearings per assembly and is dependent on specific design requirements; the number of roller bearings can range from two roller bearings and up 16 is the relative vertical motion (Z-direction, see Cartesian diagram of FIG. 1a) of the handler plate 10 with respect to the test head plate 12

17 is (one of two) roller assemblies that have been provided in the X-direction of the handler plate 10 at a second Y-coordinate of the handler plate 18 is the relative X-direction motion of receiver block assemblies 20/21 and 23/25 with respect to the test head plate 12

20 is a first receiver block assembly that is part of the test head plate 12

21 is a second receiver block assembly that is part of the test head plate 12; receiver block assemblies 20 and 21 are mounted in the X-direction of the test head plate 12

22 is a receiver block that is part of the receiver block assembly 20. The test head plate can be provided with a total of four receiver block assemblies 22 whereby these four receiver block assemblies are mounted on the four corners of the test head plate with one receiver block assembly on each of the four corners of the test head plate 12. The method and apparatus of the invention are not limited to four receiver block assemblies per test head plate but can, dependent on specific design requirements, be extended beyond the number of four or can be reduced to two or three receiver block assemblies 23 and 25 are receiver block assemblies that are mounted in the X-direction of the test head plate 12 but that have Y-coordinates of the test head plate 12 that differ from the Y-coordinates of the receiver block assemblies 20/21

Figure 2A:
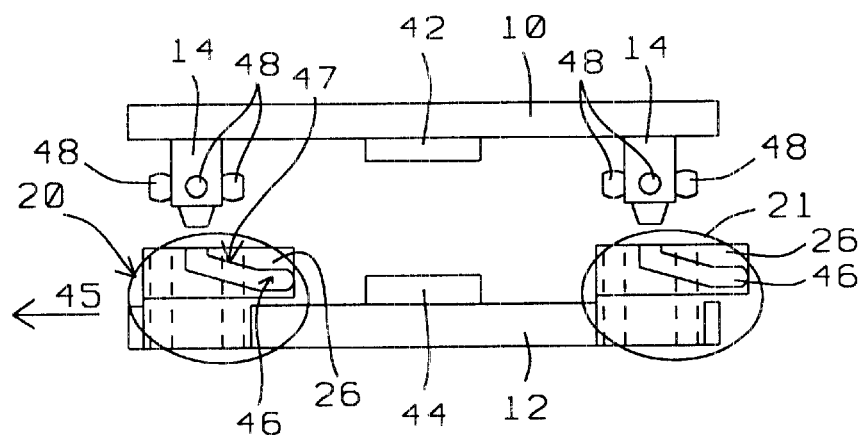
FIG. 2a shows a cross section of the handler plate and the test head plate at the time when these two plates are not engaged but are in approximate alignment with each other. Cross sections of the components that are part of the two assemblies are also indicated.
Figure 2B:
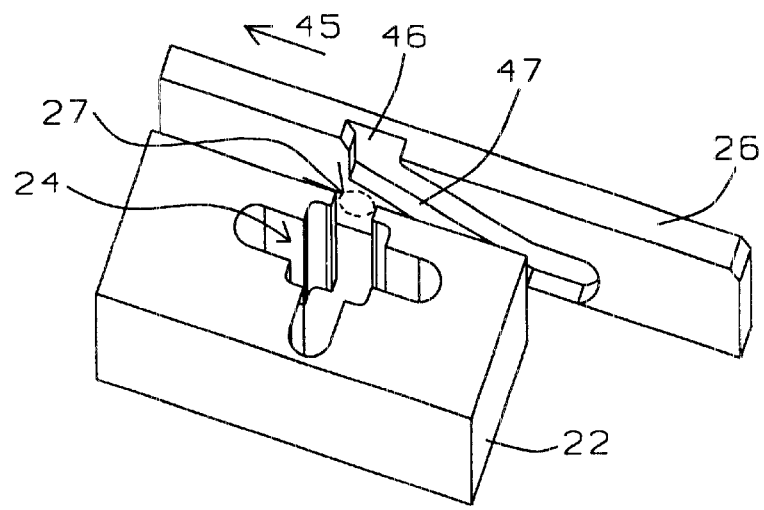
FIG. 2b shows a three dimensional view of a receiver block and a sliding block.
Figure 2C:
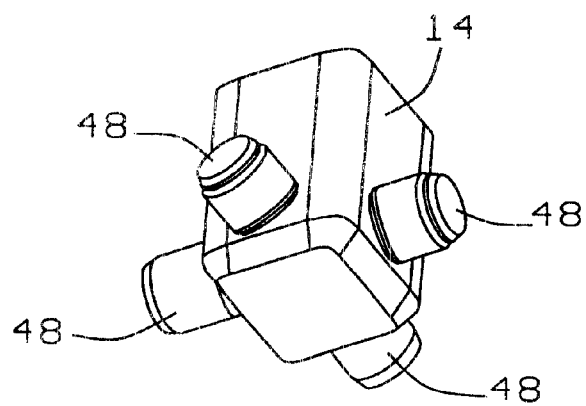
FIG. 2c shows a three dimensional view of a roller assembly with roller bearings.

24 is a cavity that has been provided in the receiver block 22 whereby the horizontal cross section of cavity 24 is essentially the same as the horizontal cross section of the roller block assembly 14 such that the roller assembly 14 can penetrate cavity 24 and is, in this penetration, guided by the inside walls of cavity 24 (see FIGS. 2b and 2c following). Each receiver block of the invention is provided with a cavity that is identical to cavity 24

26 is a sliding block that is attached to the receiver block 22 such that the sliding block 26 and the receiver block 22 form one mechanical unit that moves in unison. Key to the method of the invention is that the sliding block 26 has been provided with a cavity (not shown in FIG. 1a) that matches and aligns with one of the roller bearings of the roller assembly 14. The function of this cavity will become clear under the following artwork of the present invention 28 is a pivot linkage assembly that contains components 30, 32, 34, and 36, these components will be explained following 30 is an X-directional cross-link bar that interconnects receiver block assembly 20 with receiver block assembly 21. The distance between receiver block assembly 20 and receiver block assembly 21 remains fixed once these two receiver block assemblies have been interconnected by the X-directional cross link bar 30

32 is an Y-directional cross-link bar that interconnects receiver block assemblies 20/21 with receiver block assemblies 23/25. The distance between receiver block assemblies 20/21 and receiver block assemblies 23/25 remains fixed once these two receiver block assemblies have been interconnected by the Y-directional cross link bar 32

34 is an insertion handle that is used (by an operator) to force the roller assembly into the cavity 24 of the receiver block 22 by means of the cavity (not shown in FIG. 1a) that has been provided for this purpose in the sliding block 26

36 is an insertion plate to which the insertion handle 38 is mechanically and fixedly attached, the insertion plate 36 translates the rotational motion of insertion handle 34 into a sliding motion of the sliding block 26 (see FIGS. 1b and 1c following)

37 is the point at which the insertion plate 36 is rotationally attached to the test head plate 12

38 is the direction of rotation that is provided by an operator to the insertion plate 36 by means of the insertion handle 34

39 is a cut-out in the insertion plate 36 through which a motion pin (not shown) that is attached to the sliding block 26 can slide thereby translating the rotational motion 38 of handle 34 into a sliding motion of the sliding block 26 (see FIGS. 1b and 1c following). At the time that the roller bearing has been (manually) inserted into the cavity (not shown in FIG. 1a) that has been provided for this purpose in the sliding block 26 to the point where the roller bearing can be engaged by the cavity, the operator turns the insertion handle 34 thereby rotating the insertion plate 36 thereby translating the rotation of the insertion plate 36 into a sliding motion of the sliding block 26. The sliding motion of the sliding block 26 forces the roller assembly 14 further into the cavity 24 of the receiver block 22 in a direction 16 and toward the test head plate 12, and 40 is the pivoting point for the Y-directional cross link bar 32; by providing the Y-directional cross link bar 32 the insertion of roller bearings that belong to roller assemblies 14 that have been provided in the X-direction of the handler plate 10 at a first Y-coordinate of the handler plate is coordinated with the insertion of the roller bearings that belong to roller assemblies 17 that have been provided in the X-direction of the handler plate 10 at a second Y-coordinate of the handler plate. This latter action that is provided by the pivot link assembly 28 is important for the concurrent and accurate insertion of X-directional roller bearings that have been provided at different Y-dimensions of the handler plate 10.

FIGS. 1b and 1c further highlight the operation of the insertion plate 36 in conjunction with the sliding block 26. The views that are shown in FIGS. 1b and 1c demonstrate how the rotational action of the plate 36 is transposed into a sliding action of the sliding plate 26. The components that are shown in FIGS. 1b and 1c have previously been highlighted under FIG. 1a with the exception of the pin 27, which is attached to and forms part of the sliding block 26.

Pin 27 is inserted into the slot 39 that has for this purpose been provided in plate 36, plate 36 rotates around point 37 as a consequence of the rotating action 38 (FIG. 1a). During the rotation of plate 36 therefore pin 27 will be moved to different positions inside slot 39, which in turn forces the sliding block 26 to move to different positions. In short: by turning the handle 34, the sliding block 26 is moved under the actions that are highlighted by FIGS. 1b and 1c.

Figure 1D:
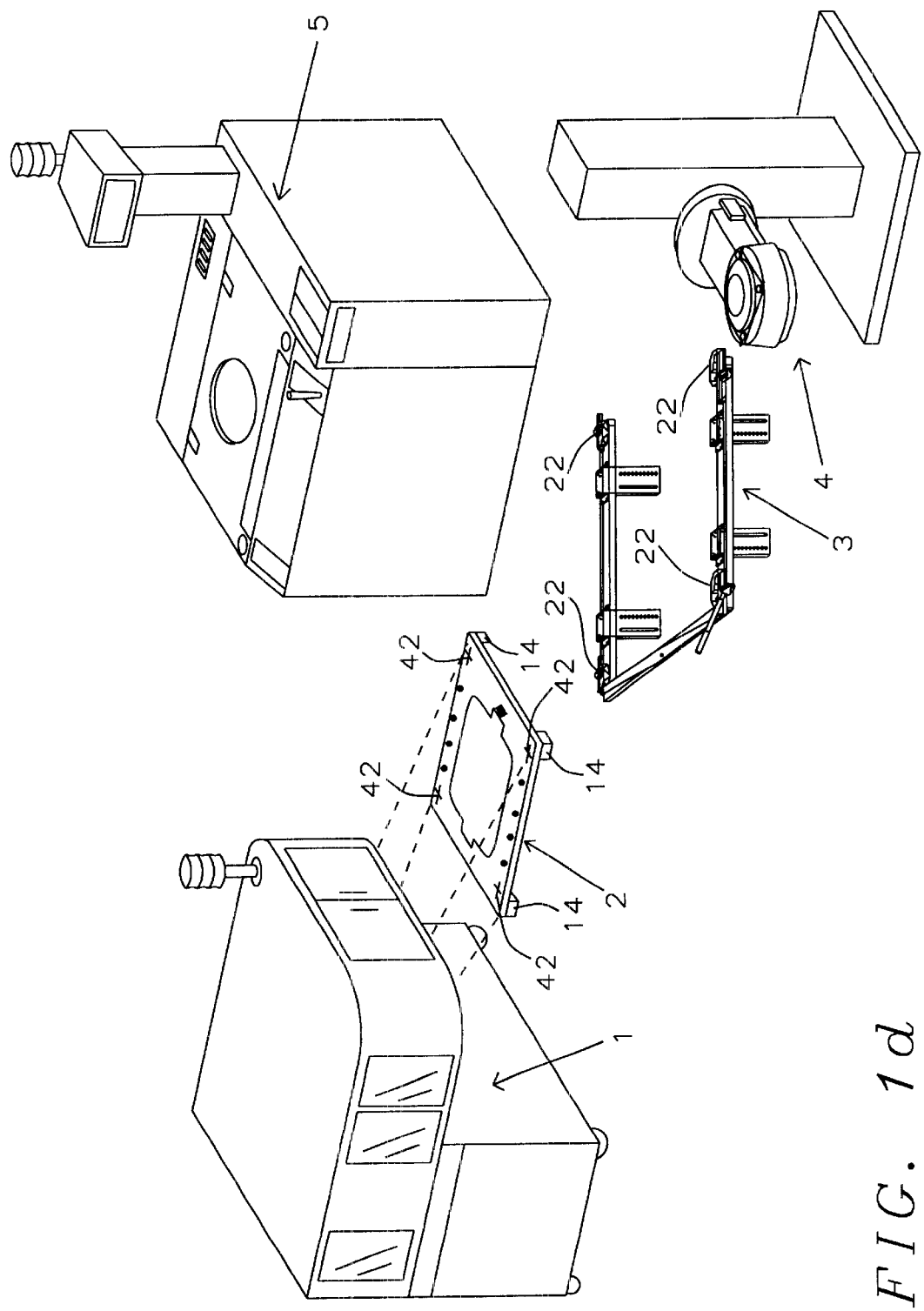
FIG. 1d shows the relative positioning of major system components, such as device handler, a device prober and the like, that make use of the docking system of the invention.

Referring now specifically to FIG. 1d, there is shown the relative positioning of the device handler 1, the device prober 5, the device test head 4, and the two Universal Docking System (UDS) plates, that is the UDS handler plate 2 and the UDS test head plate 3. The UDS handler plate 2 together with the UDS test head plate 3 form a mechanical system, which aligns, connects and disconnects with respect to each other by means of four pairs of interlocking mechanical sub-assemblies.

The UDS handler plate 2 (FIG. 1d) is attached to the device handler 1 (FIG. 1d) or the device prober 5 (FIG. 1d). Its function is equivalent to the test handler function, the UDS test head plate 3 (FIG. 1d) is attached to the device test head plate 4 (FIG. 1d). The UDS handler plate 2 (FIG. 1d) with its subassembly plus the UDS test head plate 3 (FIG. 1d) with its subassembly form the Robust Universal Docking System (R-UDS). The UDS serves as the mechanism for aligning, connecting and disconnecting the two systems with they interface. In FIG. 1d, these two systems are device handier and the device tester.

FIG. 2a shows a cross section of the handler plate 10 and the test head plate 12 at the time when these two plates are not engaged but are in approximate alignment with each other. Cross sections of the components that are part of the two assemblies are the following:

42 is an assembly of electrical contact points that are provided in the handler plate 44 is an assembly of electrical contact points that are provided in the test head plate 46 is a cavity that has been provided in the sliding block 26 and that is used for the insertion of the roller assembly by means of the roller bearings as detailed above 47 is the slope of cavity 46, and 48 are the roller bearings of the roller assembly 14.

The profile of the cavity 46 that is provided in the sliding block 26 is such that if the sliding block 26 is moved in direction 45 after a roller bearing 48 has been inserted into the cavity 46 to the point where the upper surface of the roller bearing is at the level or slightly below the slope 47 of the cavity 46, the slope 47 will press the roller bearing 48 in a downward direction (Z-direction) as a result of the force 34 (FIG. 1a). The receiving block assemblies 20/21 (FIG. 1a) will, as a result move in the direction 45 which further results, as detailed above and by the means of the pivot linkage assembly 28 and the pivoting of the cross link bar 32 that pivots around the pivoting point 40, in a movement of block assemblies 23/25 in a direction that is opposite to direction 45.

FIG. 2b shows three dimensional views of the receiver block 22 with the matched sliding block 26 and the groove 46 that has been provided in the sliding block 26. It is clear from FIG. 2b that if a roller assembly is entered into cavity 24 whereby one roller bearing 48 (FIG. 2c) protrudes through opening 29 and into groove 46, the slope 47 of groove 46 can further force the roller assembly into the cavity 24 if the sliding block 26 moves in direction 45.

FIG. 2c shows a three dimensional view of the roller assembly 14 with the thereto attached roller bearings 48.

Figure 2D:
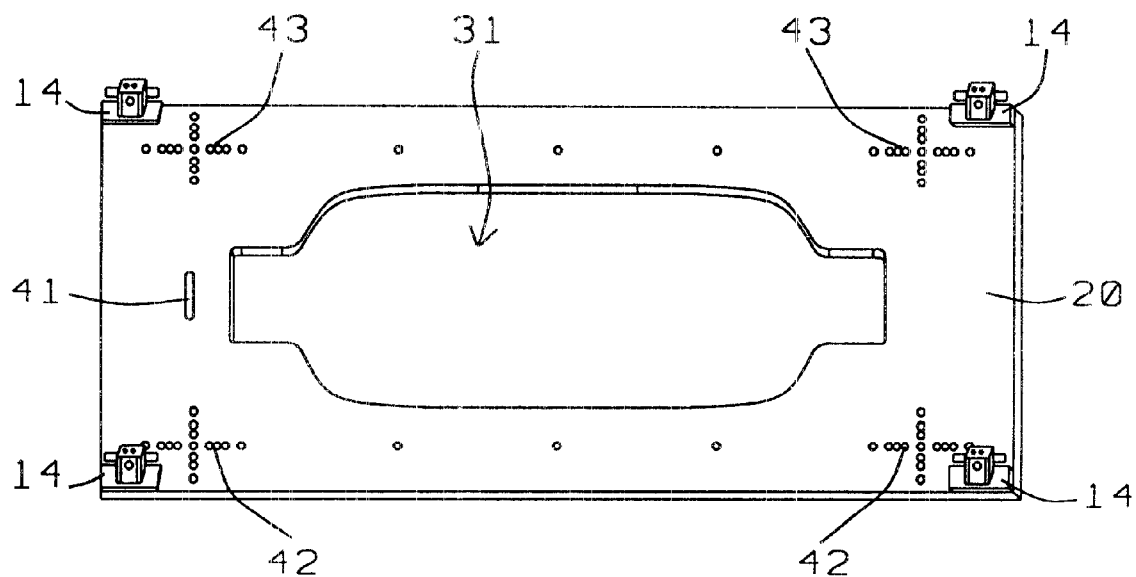
FIG. 2d shows the UDS handler plate in more detail.

FIG. 2d provides additional detail regarding the UDS handier plate 20. In a typical application, the UDS handier plate 20 is an 8 mm thick aluminum plate that is 876×876 mm square in size. The dimensions for this plate are however not limited to the typical dimensions indicated, the center 31 of the UDS handier plate 20 is cut out so as not to interfere with any electrical or mechanical components of the test head. The UDS handier plate 20 is mounted against the device handler base plate. Threads are tapped into the handler base plate for screws to fasten the UDS handier plate 20 with the handier base plate.

FIG. 2d also shows the UDS handier plate 20 with adjustment slot guides 41 and side adjustment hole locations 43. For conversions of the tester where testing is required on more than one center site, such as a second or third site testing, the slot guides 41 are used in conjunction with a suspended screw (not shown) attached to the device handler 1 (FIG. 1d) to shift the UDS handler plate 2 (FIG. 1d) into the second or third test position. The site adjustments have the same function in adjusting the UDS handler plate 2 (FIG. 1d) to positions other than the central test position with respect to the test head 4 (FIG. 1d).

Figure 3A:
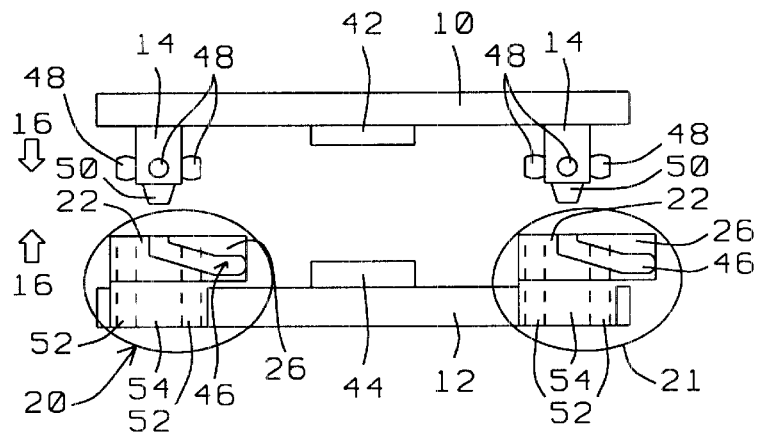
FIG. 3a shows a cross section of the handler plate and the test head plate during the initial step of the docking process between the handler plate and the test head plate.

FIG. 3a shows a cross section of the handler plate 10 and the test head plate 12 during the initial step of the docking process between the handler plate and the test head plate. The roller assemblies 14 are initially positioned into the openings 24 (FIG. 1a) of the receiver block 22. The cone shaped extension 50 of the roller assembly aids in positioning the roller assembly with respect to the geometric center of the openings 24. Further shown in FIG. 3a are the regions within the openings 24 where the parts that make up the roller assembly will penetrate the opening, as follows:

the regions highlighted as 52 that are bounded by the dotted lines on each side of the regions are the regions where the roller bearings of the roller assembly will penetrate the opening 24, and the regions highlighted as 54 that are bounded by the dotted lines on each side of the regions are the regions where the main body of the roller assembly will penetrate the opening 24.

Figure 3B:
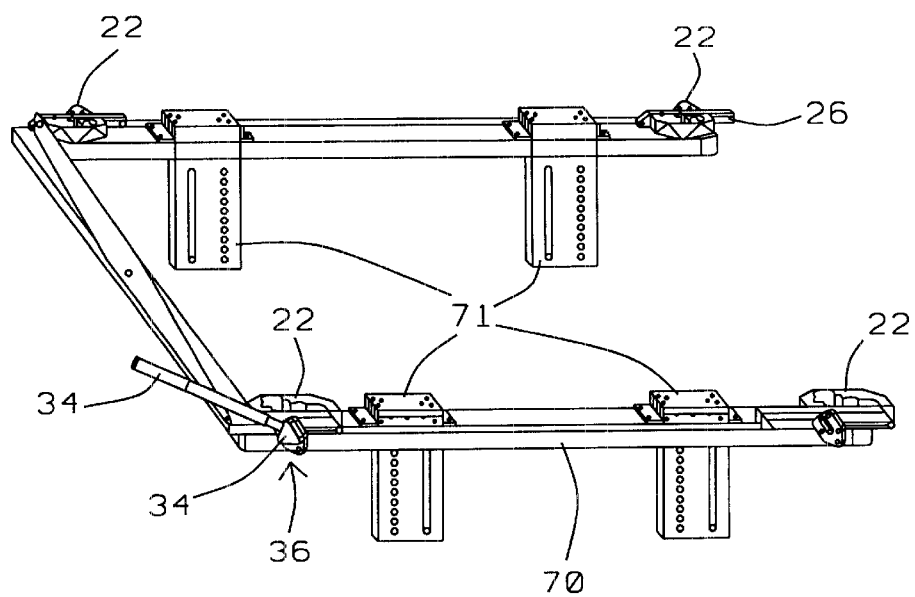
FIG. 3b shows further detail regarding the test head plate.

FIG. 3b shows the test head plate 70, this assembly has three main bar members (not highlighted) which are mounted in a "U" shape structure. The U-shaped structure mounts around the device test head 4 (FIG. 1d) using adjustable "Zee mounting brackets" 71. The Zee mounting brackets help to adjust and lock the test head plate 70 in a required position in the "Z" direction, depending on the thickness of the test socket interface.

Figure 7:
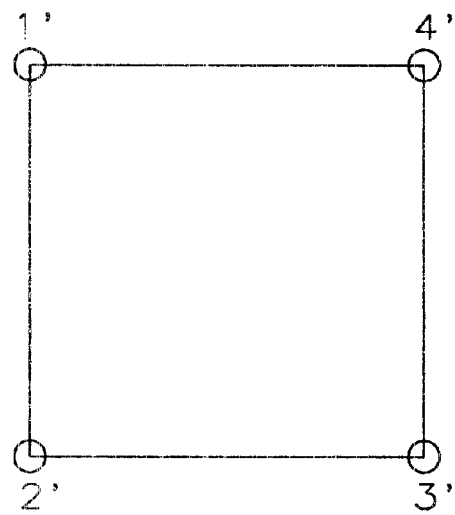
FIG. 7 shows a docking square.
Figure 8:
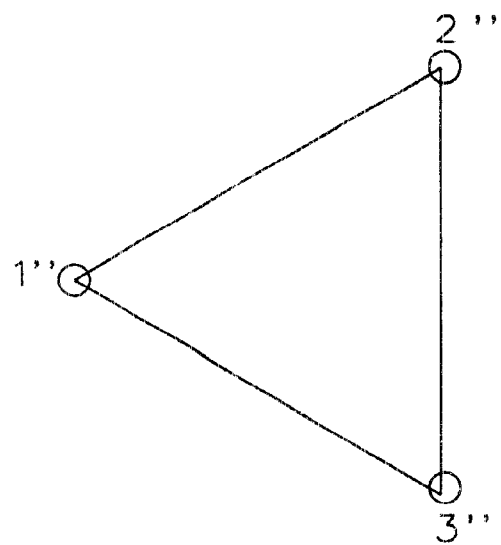
FIG. 8 shows a docking triangle.

Basic geometry teaches that three points fixed in space define a plane. It is therefore apparent that, in order to accomplish the alignment of one plane with another, such as the UDS handler plate 2 (FIG. 1d) with the UDS test head plate 3 (FIG. 1d), three points of suspension suffice for each of these two plates. This leads to the concept of the three point docking system. This as opposed to the four point docking system as highlighted in FIG. 2d and FIG. 3b where the UDS handler plate 20 and the UDS test head plate 70 are detailed. FIG. 7 and FIG. 8 highlight the concept of the four and three point docking system respectively, this is further highlighted below.

Figure 4:
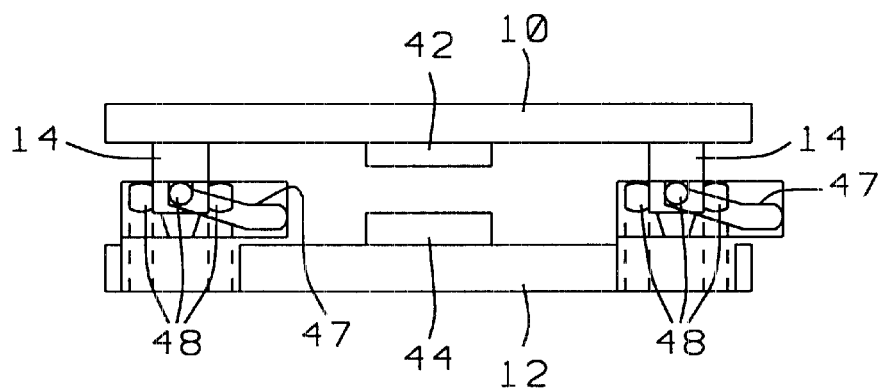
FIG. 4 shows a cross section of the handler plate and the test head plate at the point during the docking process when the roller bearings of the roller assembly have been partially inserted into the receiver block assembly of the test head plate.

FIG. 4 shows a cross section of the docking process when the roller bearings 48 of the roller assembly 14 have been partially inserted within the receiver block assemblies 20 and 21 (or 23/25) of the test head plate 12. The roller bearings 48 are at this point far enough inserted into opening 24 of the receiver block assemblies that the slope 47 of cavity 46 that has been provided in the sliding block 26 can engage the roller bearings. This engaging of the roller bearings is achieved by the rotating motion of insertion handle 38 (FIG. 1a). The sloping profile of the cavity 47 will, as previously highlighted under FIG. 2a, further force the roller bearings into the cavity 24 of the receiver block thereby pressing the handler plate 10 closer to the test head plate 12. It must be noted that, at the time that the roller bearings can be engaged by the sloping cavity 46, the points of electrical contact that are present in the handler plate 10 and in the test head plate 12 are aligned even though at this time these contact points are yet are not touching (FIG. 4).

Figure 5:
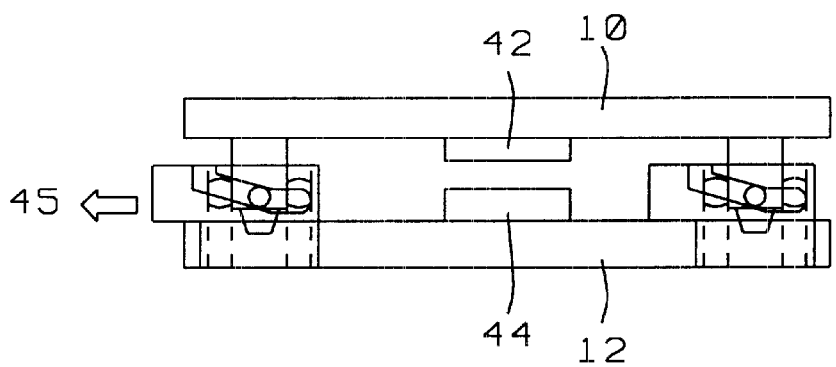
FIG. 5 shows a cross section of the handler plate and the test head plate at the point during the docking process when the pivoting link assembly of the sliding blocks (that are attached to the receiver blocks of the test head plate) pushes the sliding blocks in a horizontal direction forcing the roller assembly down along a sloping cavity that is provided in the sliding block thereby forcing the roller bearing/roller assembly into the receiver block.

FIG. 5 shows a cross section of the handler plate 10 and the test head plate 12 at the point during the docking process when the pivoting link assembly of the sliding blocks (that are attached to the receiver blocks of the test head plate) pushes the sliding blocks in a horizontal direction 45, forcing the roller bearings 48 down along the sloping surface 47 of cavity 46 (FIG. 2b) that is provided in the slider block 26 (FIG. 2b), thereby forcing the roller assembly 14 into the receiver blocks 20/21 and 23/25. Concurrent with this motion the electrical contact points provided in assemblies 42 (for the handler plate 10) and 44 (for the test head plate 12) are brought closer together.

Figure 6:
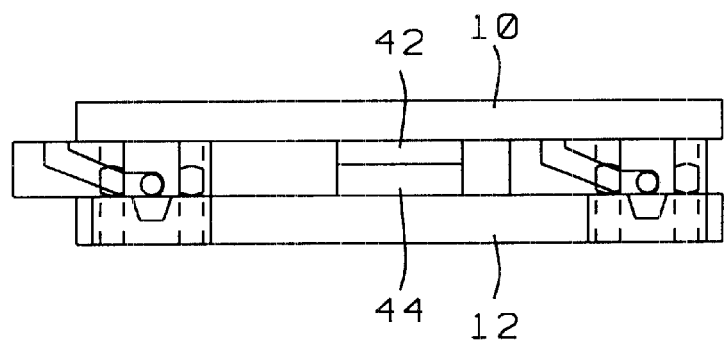
FIG. 6 shows a cross section of the handler plate and the test head plate at the point during the docking process when the roller bearings (of the roller assembly of the handler plate) have been fully inserted into the receiver assemblies (of the test head plate) thereby positioning and docking the handler plate with respect to the test head plate and thereby furthermore establishing electrical contact between the electrical contacts of the handler plate and the electrical contacts of the test head plate.

FIG. 6 shows a cross section of the handler plate 10 and the test head plate 12 at the point during the docking process when the roller bearings 48 (of the roller assemblies 14 of the handler plate 10) have been fully inserted into the receiver assemblies 20/21 and 23/25 (of the test head plate 12) thereby positioning and docking the handler plate with respect to the test head plate and thereby furthermore establishing electrical contact between the electrical contacts 42 of the handler plate 10 and the electrical contacts 44 of the test head plate 12. It must be noted from the cross section that is shown in FIG. 6 that the sloping nature of cavity 47 is, at the end of the trajectory of the roller bearings 48 into cavity 24, the sloping nature of the cavity is converted into a horizontal top surface of the cavity. This horizontal or end section of cavity 47 provides the point where the roller bearings come to rest after insertion and is therefore needed as a horizontal surface (for the roller bearings) in order to provide stability in the (final) positioning of the roller bearings.

It further deserves pointing out that the cross section that is shown in FIG. 6, which shows a set of two roller assemblies and two receiver block assemblies, can be replicated by a similar cross section that can be made of the second set of two roller assemblies and two receiver block assemblies that are part of the method and apparatus of the invention. This second cross section will look similar to the cross section that is shown in FIG. 6 due to the action of the cross bar 32 and the pivoting action 40 that is provided to this cross bar 32. This cross bar engages the second set of roller assemblies and receiver block assemblies causing these roller assemblies and receiver block assemblies to be engaged and lock as shown for the first set of roller assemblies and receiver block assemblies in FIG. 6.

Referring now to FIG. 7, there is shown how the four points 1', 2', 3' and 4' provide docking possibilities of 0-degree, 90-degree and 180-degree docking rotation.

Referring to FIG. 8, there is shown a three point docking configuration whereby three points 1", 2" and 3" provide less freedom in possible docking configurations since this configuration limits the docking to one configuration. This limitation is however not to be considered a drawback or limitation of the present invention since there are conditions of device testing where this configuration, due to its very simplicity, can be a configuration of choice, most notably where considerations of high device throughput, speed of test set up and the like are of importance.

It is clear that the method and process of the invention, that has as objective the positioning and docking of a handler plate with respect to a test head plate, can be provided with a number of variations that are directly derived from the method and process that has been described in detail. For instance, the number of roller assemblies can be varied as can the number of receiver block assemblies. The method and process of the invention can in this manner be applied to a large surface where such an application is of benefit. Increasing the number of roller assemblies and receiver block assemblies can also result in increased accuracy of alignment and in increased stability of the docking condition. The method and process of the invention is therefore not limited to the steps and apparatus that has been described above and that serve as an example that can readily be extended in order to extend the use and benefit that is provided by the invention.

Although the invention therefore has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An apparatus for positioning a semiconductor device handler plate with respect to a semiconductor device test head plate for the purpose of docking and undocking said handler plate with said test head plate, comprising:

a handler plate having a dimension of length in an X-direction in addition having a dimension of width in an Y direction, whereby said Y direction intersects said X direction under a right angle, further having a dimension of height in an Z direction, whereby said Z direction intersects a plane comprising said X and said Y direction under a right angle;

roller assemblies attached to said handler plate;

an assemblage of first electrical contacts attached to said handler base plate for purposes of semiconductor device testing;

a test head plate having a dimension of length in an X-direction in addition to having a dimension of width in an Y direction, said Y direction intersecting said X direction under a right angle, further having a dimension of height in an Z direction, said Z direction intersecting a plane comprising said X and said Y direction under a right angle, said test head X-direction and Y-direction and Z-direction coinciding respectively with said handler plate X-direction and Y-direction and Z-direction;

receiver block assemblies being attached to said test head plate, said receiver block assemblies comprising a receiver block in addition to comprising a sliding block, each receiver block and each sliding block having a dimension of length in an X-direction in addition to having a dimension of width in an Y direction, said Y direction intersecting said X direction under a right angle, further having a dimension of height in an Z direction, said Z direction intersecting a plane comprising said X and said Y direction under a right angle, said receiver block and said sliding block X-direction and Y-direction and Z-direction coinciding respectively with said handler plate X-direction and Y-direction and Z-direction;

an assemblage of second electrical contacts attached to said test head plate for purposes of semiconductor device testing; and a pivot linkage assembly, said pivot linkage assembly being attached to said test head plate, said pivot linkage assembly forming a mechanical linkage between said receiver block assemblies.

2. The apparatus of claim 1 wherein said dimension of height and said dimension of width and said dimension of height of said handler plate are essentially not the same as said dimension of height and said dimension of width and said dimension of height of said of said test head plate.

3. The apparatus of claim 1 wherein said dimension of height and said dimension of width and said dimension of height of said receiver block are smaller than said dimension of height and said dimension of width and said dimension of height of said test head plate by a measurable amount.

4. The apparatus of claim 1 wherein said dimension of length of said each of sliding block is about the same or longer as said dimension of length of each of said receiver block while said dimension of width of each of said sliding block is smaller that said dimension of width of each of said receiver block by an amount, said dimension of height of each of said sliding block being about equal to said dimension of height of each of said receiver block.

5. The apparatus of claim 1, a cross section of said handler plate in a plane parallel to a plane comprising said X and said Y directions of said handler plate being a rectangle or a square, said square having a geometric center being a point of intersection of two diagonals of said rectangle or said square of said handler plate, whereby said assemblage of first electrical contact points is attached to said handler base plate.

6. The apparatus of claim 5, said assemblage of first electrical contacts attached to said handler base plate having cross section in a plane parallel to a plane comprising said X and said Y directions of said handler plate being a rectangle or a square, said rectangle or square having a geometric center being a point of intersection of two diagonals of said rectangle or said square of said assemblage of first electrical contacts, said geometric center of said assemblage of first electrical contacts aligning with said geometric center of said handler plate, furthermore said assemblage of first electrical contact points interfacing with said assemblage of second electrical contact points attached to said test head.

7. The apparatus of claim 6, said assemblage of second electrical contacts attached to said test head having a cross section in a plane parallel to a plane comprising said X and said Y directions of said test head plate being a rectangle or a square, said rectangle or square having a geometric center being a point of intersection of two diagonals of said rectangle or said square, said geometric center of said assemblage of second electrical contacts aligning with said geometric center of said assemblage of first electrical contacts.

8. The apparatus of claim 7 wherein a cross section of said test head plate in a plane parallel to a plane comprising said X and said Y directions of said test head plate is a rectangle or a square, said rectangle or square having a geometric center being a point of intersection of two diagonals of said rectangle or said square, said geometric center of said test head plate aligning with said geometric center of said assemblage of second electrical contacts.

9. The apparatus of claim 1 wherein a cross section of said receiver block in a plane parallel to a plane comprising said X and said Y directions is a rectangle or a square.

10. The apparatus of claim 1 wherein a cross section of said sliding block in a plane parallel to a plane comprising said X and said Y directions is a rectangle or square.

11. The apparatus of claim 1 wherein said roller assemblies are evenly spaced around a circumference of said handler plate whereby further said roller assembly are mounted on a surface of said handler plate such that said roller assemblies face said test head plate.

12. The apparatus of claim 1, wherein said receiver block assemblies are evenly spaced around a circumference of said test head plate, whereby furthermore each of said receiver block assemblies is mounted on a surface of said handler plate such that each of said receiver block assemblies faces said handler plate, whereby furthermore said receiver block assemblies align with said roller assemblies while one receiver block assembly is mounted on said test head plate for each roller assembly mounted on said handler plate.

13. The apparatus of claim 1 whereby:

each of said receiver blocks have been provided with a cavity;

each of said receiver blocks have a top surface, whereby said cavity that has been provided in each of said receiver blocks penetrates said top surface and further extends in said Z direction of each of said receiver blocks, whereby said cavity may or may not extend through each of said receiver blocks in said Z direction, whereby said penetration of said cavity through said top surface of each of said receiver blocks has a circumference forming a receiver block top surface profile; and each of said sliding blocks which are attached to said receiver blocks are attached to a receiver block in a X direction of said receiver block, whereby each of said sliding blocks have a groove provided in a surface, further having a pin like extrusion provided on a surface, whereby each of said sliding blocks further have a top surface, whereby said groove provided in said surface of each of said sliding blocks penetrates said top surface, said penetration having a circumference forming a sliding block top surface profile.

14. The apparatus of claim 13 wherein said cavity that has been provided in each of said receiver block is further extended into said test head plate in said Z-direction of said test head plate.

15. The apparatus of claim 13 wherein said groove is provided in a surface that forms an interface between each of said sliding block and a receiver block, whereby a center line of said groove in each of said sliding block initially and starting at said top surface of each of said sliding block penetrates said top surface and proceeds over a distance in a Z direction of each of said sliding block after which said center line of said groove continues over a distance in a direction under an angle of between 5 and 45 degrees with said top surface of each of said sliding block after which said center line of said groove continues over a distance in a direction parallel with said top surface of each of said sliding block.

16. The apparatus of claim 13 wherein each of said receiver block assemblies have a top surface, whereby said cavity that has been provided in each of said receiver blocks, said groove having been provided in a surface of each of said sliding blocks penetrates said top surface of each of said receiver block assembly, whereby said sliding block top surface profile aligns with and forms an extension to at least one extremity of said receiver block top surface profile, thereby forming a receiver block assembly top surface profile, whereby said receiver block assemblies interfaces with said roller assemblies.

17. The apparatus of claim 16 wherein each of said roller assemblies comprises:
 a main body that extends lengthwise in a Z direction of said handler plate; and
 roller bearings that extend in radial direction from said main body of said roller assembly in a plane comprising said X and said Y directions of said handler plate.

18. The apparatus of claim 17 wherein said main body of each of said roller assembly has a cross section that is a circle, a square or a rectangle.

19. The apparatus of claim 17, said roller bearings being evenly spaced around a circumference of said main body of said roller assembly, said radial extensions of said roller bearings from said main body of said roller bearing assembly having a direction, a cross section of said roller bearings in a plane perpendicular to said direction being a circle.

20. The apparatus of claim 17 wherein:
 said main body of each of said roller assembly has a geometric center line being a line created by interconnecting geometric centers of two different cross sections of said main body of each of said roller assemblies, whereby said cross sections of said main body of each of said roller assemblies are taken in a plane parallel to a plane comprising said X and said Y directions, said geometric centers of said cross sections being defined as a point of intersect of diagonals for square or rectangular cross sections and a center of a circle for a circular cross section;
 each of said roller bearings of said roller assembly have a geometric center line being a line created by interconnecting geometric centers of two different cross sections of said roller bearings of said roller assembly, whereby said cross sections of each of said roller bearings of each of said roller assembly are taken in a plane perpendicular to said radial direction under which each of said roller bearings extend from said main body of said roller assemblies, said geometric centers of said cross sections being defined as a center of a circle for a circular cross section; and
 said geometric center line of said main body of each of said roller assemblies intersecting with said geometric center lines of said roller bearings of said roller assembly, thereby forming a geometric center point of said roller bearing assembly.

21. The apparatus of claim 17 wherein a cross section of each of said roller assemblies taken in a plane parallel with a plane comprising said X and said Y directions of said handler plate and that further comprises said geometric center lines of each of said roller bearings has a roller assembly circumference, whereby said roller assembly circumference is about equal to said top surface receiver block assembly profile, whereby enough tolerance is provided between said roller assembly circumference and said top surface receiver block assembly profile such that said roller assembly can freely move inside said cavity provided in said receiver block in a Z-direction of said receiver block.

22. The apparatus of claim 13 wherein said pin like extrusion provided on a surface of each of said sliding block is provided opposite said surface in which said groove is provided in said sliding block, whereby said pin shaped extrusion serves as a mechanical link between said sliding block of said receiver block assembly and said pivot linkage assembly.

23. The apparatus of claim 22 wherein said pivot link assembly is mechanically coupled to said sliding block of said receiver block assembly and comprises:
 an insertion plate;
 a first cross link bar that connects to a first sliding block or interconnects first adjacent sliding blocks, whereby said first adjacent sliding blocks are mounted in an X-direction of said test head plate;
 a second cross link bar that interconnects second adjacent sliding blocks, whereby said second adjacent sliding blocks are mounted in an Y-direction of said test head, whereby said second cross link bar rotationally connects to an extremity of said first cross link bar; and
 a third cross link bar that connects to a second sliding block or interconnects third adjacent sliding blocks in an X-direction of said test heat plate, whereby said third cross link bar rotationally connects to said second cross link bar.

24. The apparatus of claim 23 wherein said first and said third cross link bar have a cross section that is a rectangle or a square or a circle.

25. The apparatus of claim 23 wherein said second cross link bar have a cross section that is a rectangle whereby a longest side of said rectangle is parallel to a plane comprising said X and Y-direction of said test head plate.

26. The apparatus of claim 23, said insertion plate comprising:
 a slot that may or may not penetrate said insertion plate into which said pin like extrusion provided on a surface of said sliding block is entered;
 a point of rotation, whereby said insertion plate is rotationally connected to said test head plate; and
 a handle that allows rotation of said insertion plate, thereby transferring rotational movement of said insertion plate into sliding motion of said sliding block.

27. The apparatus of claim 23, said second cross link bar comprising an opening penetrating said second cross link bar, a pin being inserted through said opening, said pin being connected to said test head plate, allowing said second cross link bar to swivel around said pin.

28. A method for positioning a semiconductor device handler plate with respect to a semiconductor device test head plate for the purpose of docking and undocking said handler plate with said test head plate, comprising:
 providing a handler plate having a dimension of length in an X-direction in addition having a dimension of width in an Y direction whereby said Y directional intersects said X direction under a right angle further having a dimension of height in an Z direction whereby said Z direction intersects a plane comprising said X and said Y direction under a right angle;
 providing roller assemblies that are attached to said handler plate;
 providing an assemblage of first electrical contacts that is attached to said handler base plate for purposes of semiconductor device testing;
 providing a test head plate having a dimension of length in an X-direction in addition having a dimension of width in an Y direction, whereby said Y direction intersects said X direction under a right angle, further having a dimension of height in an Z direction, whereby said Z direction intersects a plane comprising said X and said Y direction under a right angle, whereby said test head X-direction and Y-direction and Z-direction coincide respectively with said handler plate X-direction and Y-direction and Z-direction;
 providing receiver block assemblies attached to said test heat plate, said receiver block assemblies having a top surface having a top surface receiver assembly profile, whereby said receiver block assemblies are attached to said test head plate, whereby said receiver block assemblies comprise a receiver block having a top surface having a receiver block top surface profile, further having a cavity, whereby a sliding block having a groove provided in a surface, further having a pin line extrusion provided on a surface, further having a top surface having a sliding block top surface profile, whereby said sliding block is attached to said receiver block, whereby said receiver block and said sliding block each having a dimension of length in an X-direction in addition to having a dimension of width in an Y direction, whereby said Y direction intersects said X direction under a right angle, further having a dimension of height in an Z direction, whereby said Z direction intersects a plane comprising said X and said Y direction under a right angle, whereby said receiver block and said sliding block X-direction and Y-direction and Z-direction coincide respectively with said handler plate X-direction and Y-direction and Z-direction;

providing an assemblage of second electrical contacts attached to said test head plate for purposes of semiconductor device testing;

visually positioning and aligning said roller assemblies with said receiver block assemblies;

partially entering said roller assemblies into said cavity provided in said receiver blocks; and engaging a pivot linkage assembly, said pivot linkage assembly being attached to said test head plate, said pivot linkage assembly forming a mechanical linkage between said receiver block assemblies, thereby docking and locking said handler plate with respect to said test head plate while at the same time establishing electrical contact between said assemblage of first electrical contacts and said assemblage of second electrical contacts for purposes of semiconductor device testing.

29. The method of claim 28 wherein said dimension of height and said dimension of width and said dimension of height of said handler plate are not the same as said dimension of height and said dimension of width and said dimension of height of said of said test head plate.

30. The method of claim 28 wherein said dimension of height and said dimension of width and said dimension of height of said receiver block are smaller than said dimension of height and said dimension of width and said dimension of height of said test head plate by a measurable amount.

31. The method of claim 28 wherein said dimension of length of said sliding block is about the same or longer as said dimension of length of said receiver block while said dimension of width of said sliding block is smaller that said dimension of width of said receiver block by a measurable amount while said dimension of height of said sliding block is essentially the same as said dimension of height of said receiver block.

32. The method of claim 28 wherein a cross section of said handler plate in a plane parallel to a plane comprising said X and said Y directions of said handler plate is a rectangle or a square, whereby said square has a geometric center being a point of intersection of two diagonals of said rectangle or said square of said handler plate, whereby said assemblage of first electrical contact points is attached to said handler base plate for purposes of semiconductor device testing.

33. The method of claim 32 whereby said assemblage of first electrical contacts attached to said handler base plate has a cross section in a plane parallel to a plane comprising said X and said Y directions of said handler plate that is a rectangle or a square, said rectangle or square having a geometric center being a point of intersection of two diagonals of said rectangle or said square of said assemblage of first electrical contacts, said geometric center of said assemblage of first electrical contacts aligning with said geometric center of said handler plate, whereby furthermore said assemblage of first electrical contact points interfaces with said assemblage of second electrical contact points attached to said test head.

34. The method of claim 33 whereby said assemblage of second electrical contacts attached to said test head has a cross section in a plane parallel to a plane comprising said X and said Y directions of said test head plate that is a rectangle or a square, said rectangle or square having a geometric center being a point of intersection of two diagonals of said rectangle or said square, said geometric center of said assemblage of second electrical contacts aligning with said geometric center of said assemblage of first electrical contacts.

35. The method of claim 34 wherein a cross section of said test head plate in a plane parallel to a plane comprising said X and said Y directions of said test head plate is a rectangle or a square, said rectangle or square having a geometric center being a point of intersection of two diagonals of said rectangle or said square, said geometric center of said test head plate aligning with said geometric center of said assemblage of second electrical contacts.

36. The method of claim 28 wherein a cross section of said receiver block in a plane parallel to a plane comprising said X and said Y directions is a rectangle or a square.

37. The method of claim 28 wherein a cross section of said sliding block in a plane parallel to a plane comprising said X and said Y directions is a rectangle or a square.

38. The method of claim 28 wherein said roller assemblies are evenly spaced around a circumference of said handler plate whereby further said roller assemblies are mounted on a surface of said handler plate such that said roller assemblies face said test head plate.

39. The method of claim 28 wherein said receiver block assemblies are evenly spaced around a circumference of said test head plate whereby furthermore said receiver block assemblies are mounted on a surface of said handler plate such that said receiver block assemblies face said handler plate whereby furthermore said receiver block assemblies align with said roller assemblies while one receiver block assembly is mounted on said test head plate for each roller assembly that is mounted on said handler plate.

40. The method of claim 28 comprising:

each of said receiver blocks have been provided with a cavity;

each of said receiver blocks have a top surface, whereby said cavity that has been provided in each of said receiver block penetrates said top surface and further extends in said Z direction of each of said receiver block, whereby said cavity may or may not extend through each of said receiver block in said Z direction, whereby said penetration of said cavity through said top surface of each of said receiver block has a circumference that forms a receiver block top surface profile; and whereby each of said sliding blocks which are attached to a receiver are attached to said receiver blocks in a X direction of said receiver blocks, whereby said each of sliding blocks have a groove provided in a surface, further having a pin like extrusion provided on a surface, whereby each of said sliding blocks further have a top surface, whereby said groove provided in said surface of each of said sliding blocks penetrates said top surface, said penetration having a circumference forming a sliding block top surface profile.

41. The method of claim 40 wherein said cavity that has been provided in each of said receiver block is further extended into said test head plate in said Z-direction of said test head plate.

42. The method of claim 40 wherein said groove is provided in a surface that forms an interface between each of said sliding block and each of said receiver block, whereby a center line of said groove in each of said sliding block initially and starting at said top surface of each of said sliding block penetrates said top surface and proceeds over a distance in a Z direction of each of said sliding block after which said center line of said groove continues over a distance in a direction under an angle of between 5 and 45 degrees with said top surface of each of said sliding block after which said center line of said groove continues over a distance in a direction that is parallel with said top surface of each of said sliding block.

43. The method of claim 40 wherein each of said receiver block assemblies have a top surface, whereby said cavity that has been provided in each of said receiver block and said groove that has been provided in a surface of each of said sliding block penetrate said top surface of each of said receiver block assembly, whereby each of said sliding block top surface profile aligns with and forms an extension to at least one extremity of a receiver block top surface profile thereby forming a receiver block assembly top surface profile whereby each of said receiver block assemblies interfaces with roller assemblies.

44. The method of claim 43 wherein each of said roller assemblies comprise:
  a main body that extends lengthwise in a Z direction of said handler plate; and
  roller bearings that extend in radial direction from said main body of said roller assembly in a plane comprising said X and said Y directions of said handler plate.

45. The method of claim 44 wherein said main body of said roller assembly has a cross section that is a circle, a square or a rectangle.

46. The method of claim 44 wherein said roller bearings are evenly spaced around a circumference of said main body of said roller assembly, whereby said radial extensions of said roller bearings from said main body of said roller bearing assembly have a direction, whereby a cross section of said roller bearings in a plane that is perpendicular to said direction is a circle.

47. The method of claim 44 wherein:
  said main body of said roller assembly has a geometric center line which is a line that is created by interconnecting geometric centers of two different cross sections of said main body of said roller assembly, whereby said cross sections of said main body of said roller assembly are taken in a plane parallel to a plane comprising said X and said Y directions, said geometric centers of said cross sections being defined as a point of intersect of diagonals for square and rectangular cross sections and a center of a circle for circular cross section;
  each of said roller bearings of said roller assembly having a geometric center line being a line created by interconnecting geometric centers of two different cross sections of said roller bearings of said roller assembly, whereby said cross sections of said roller bearings of said roller assembly are taken in a plane perpendicular to said radial direction under which said roller bearings extend from said main body of said roller assemblies, whereby said geometric centers of said cross sections are defined as a center of a circle for circular cross section; and
  said geometric center line of said main body of said roller assembly intersecting said geometric center lines of said roller bearings of said roller assembly, forming a geometric center point of said roller bearing assembly.

48. The method of claim 44 wherein a cross section of said roller assembly taken in a plane that is parallel with a plane comprising said X and said Y directions of said handler plate and further comprising said geometric center lines of said roller bearings has a roller assembly circumference, whereby said roller assembly circumference is essentially identical to said top surface receiver block assembly profile, whereby enough tolerance is provided between said roller assembly circumference and said top surface receiver block assembly profile such that said roller assembly can freely move inside said cavity that has been provided in said receiver block in a Z-direction of said receiver block.

49. The method of claim 40 wherein said pin like extrusion provided on a surface of said sliding block is provided opposite said surface in which said groove is provided in said sliding block, said pin shaped extrusion serving as a mechanical link between said sliding block of said receiver block assembly and said pivot linkage assembly.

50. The method of claim 49 wherein said pivot link assembly is mechanically coupled to said sliding block of said receiver block assembly and comprises:
  an insertion plate;
  a first cross link bar connecting to a first sliding block or interconnecting first adjacent sliding blocks, said first adjacent sliding blocks being mounted in an X-direction of said test head plate;
  a second cross link bar interconnecting second adjacent sliding blocks, said second adjacent sliding blocks being mounted in an Y-direction of said test head, said second cross link bar rotationally connecting to an extremity of said first cross link bar; and
  a third cross link bar connecting to a second sliding block or interconnecting third adjacent sliding blocks in an X-direction of said test heat plate, said third cross link bar rotationally connecting to said second cross link bar.

51. The method of claim 50, said first and said third cross link bar having a cross section that is a rectangle, a square or a circle.

52. The method of claim 50, said second cross link bar having a cross section that is a rectangle, whereby a longest side of said rectangle is parallel to a plane comprising said X and Y-direction of said test head plate.

53. The method of claim 50 wherein said insertion plate comprises:
  a slot that may or may not penetrate said insertion plate into which said pin like extrusion provided on a surface of said sliding block is entered;
  a point of rotation whereby said insertion plate is rotationally connected to said test head plate; and
  a handle that allows rotation of said insertion plate thereby transferring rotational movement of said insertion plate into sliding motion of said sliding block.

54. The method of claim 50 wherein said second cross link bar comprises an opening that penetrates said second cross link bar, whereby further a pin is inserted through said opening, said pin being connected to said test head plate, thereby allowing said second cross link bar to swivel around said pin.

* * * * *

UNITED STATES PATENT AND TRADEMARK OFFICE
CERTIFICATE OF CORRECTION

PATENT NO. : 6,586,925 B2
DATED : July 1, 2003
INVENTOR(S) : Ramesh et al.

It is certified that error appears in the above-identified patent and that said Letters Patent is hereby corrected as shown below:

Column 7,
Lines 18 and 28, delete "handier" and insert therefore -- handler --

Column 8,
Line 2, (two occurrences) delete "handier" and insert therefore -- handler --
Lines 6, 10, 11, 12 and 52, delete "handier" and insert therefore -- handler --

Column 11,
Line 14, delete first occurrence of "of said"

Column 15,
Line 44, delete first occurrence of "of said"

Signed and Sealed this

Tenth Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,586,925 B2  
APPLICATION NO. : 09/828677  
DATED : July 1, 2003  
INVENTOR(S) : Ramamoorthi et al.

Page 1 of 1

It is certified that error appears in the above-identified patent and that said Letters Patent is hereby corrected as shown below:

On Title Page, Item (75) Inventors, delete "Ramamoorthi Ramesh" and insert therefor --Ramesh Ramamoorthi--

Signed and Sealed this

Tenth Day of April, 2007

JON W. DUDAS  
*Director of the United States Patent and Trademark Office*